United States Patent
Katsuyama et al.

(10) Patent No.: US 7,627,009 B2
(45) Date of Patent: Dec. 1, 2009

(54) LIGHT-EMITTING DEVICE ON N-TYPE INP SUBSTRATE HEAVILY DOPED WITH SULFUR

(75) Inventors: Tomokazu Katsuyama, Yokohama (JP); Michio Murata, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 66 days.

(21) Appl. No.: 11/907,135

(22) Filed: Oct. 9, 2007

(65) Prior Publication Data

US 2008/0095206 A1  Apr. 24, 2008

(30) Foreign Application Priority Data

Oct. 10, 2006  (JP)  ............... 2006-276783

(51) Int. Cl.
*H01S 5/20* (2006.01)
*H01S 5/00* (2006.01)
*H01L 33/00* (2006.01)

(52) U.S. Cl. ............... 372/45.01; 372/46.015; 257/94

(58) Field of Classification Search ............... 372/45.01, 372/46.015
See application file for complete search history.

(56) References Cited

U.S. PATENT DOCUMENTS 5,822,349 A   10/1998   Takaoka et al.
6,984,538 B2 * 1/2006   Ooi et al. ............ 438/22
7,122,846 B2 * 10/2006  Kish et al. ............ 257/96
2005/0078724 A1 * 4/2005  Massara et al. ............ 372/45

FOREIGN PATENT DOCUMENTS

JP   08-250808   9/1996

* cited by examiner

*Primary Examiner*—Armando Rodriguez
(74) *Attorney, Agent, or Firm*—Smith, Gambrell & Russell, LLP

(57) ABSTRACT

The present invention provides a structure of a light-emitting device which prevents the inter diffusion of impurities from the high-doped n-type InP substrate to a p-type current blocking layer. The substrate of the invention is highly doped with sulfur (S) to obtain high quality surface whose etch pit density (EPD) is less than 100 cm$^{-2}$. The device includes such substrate, an optical guiding portion with an active layer, and a current blocking portion provided so as to bury the guiding portion. This current blocking portion includes, from the side of the substrate, a p-type layer, an n-type layer and another p-type layer. The device of the invention provides an n-type layer that is moderately doped with silicon between the n-type substrate and the p-type current blocking layer to prevent the inter diffusion of impurities from the substrate to the p-type layer.

10 Claims, 4 Drawing Sheets

LIGHT-EMITTING DEVICE ON N-TYPE INP SUBSTRATE HEAVILY DOPED WITH SULFUR

BACKGROUND OF THE INVENTION

1. Field of the Invention

The present invention relates to a semiconductor light-emitting device, in particular, to a light-emitting device primarily comprised of InP based material.

2. Related Prior Art

FIG. 4 is a cross section showing a structure of a conventional light-emitting device 100, which primarily comprises of InP based material. The device 100, which may be a semiconductor laser diode, includes an n-type InP substrate 101, an optical guiding portion 102 formed on the substrate 101, a current blocking portion 103 provided so as to bury the optical guiding portion 102, and a p-type layer 104 provided on the optical guiding portion 102 and the current blocking portion 103. This p-type layer 104 includes a p-type InP layer in the lower side and a p-type InGaAs layer thereon.

The guiding portion 102 includes, from the side of the n-type InP substrate, an n-type InP layer 105, an active layer 106 on the n-type layer 105, and a p-type layer 106 on the active layer 105. The current blocking portion 103 includes, from the side of the n-type InP substrate, a p-type InP layer 108, an n-type InP layer 109 on the p-type InP layer 108 and another p-type InP layer 110 on the n-type layer 108. Moreover, the device 100 provides two electrodes, one of which is the anode 112 on the p-type InP layer 102 and the other is the cathode 111 on the back surface of the n-type InP substrate.

The device 100 shown in FIG. 4 may be formed by: (1) sequentially growing the n-type InP layer 105, the active layer 106 and the p-type InP 106 on the n-type InP substrate 101; (2) etching these grown layer until the n-type substrate exposes to form the optical guiding portion 102, (3) secondary growing the p-type InP layer 108, the n-type InP layer 109 and the other p-type InP layer 110 on the substrate 101 in selective to bury the optical guiding layer, and (4) third growing the p-type layer 104 and forming two electrodes, 111 and 112. Japanese Patent Application published as JP-H08-250808A has disclosed such device and the process to obtain the semiconductor device with such structure.

The InP substrate, where the device is to be formed thereon, should have high quality as possible, in other words, the substrate should have the dislocations as low as possible. In particular, when the device includes a stress induced multi-quantum well (MQW) structure, the substrate with quite low dislocations is inevitable. Recently, it has been reported that an InP substrate heavily doped with sulfur (S) shows a quite low EPD less than 100 $cm^{-2}$.

However, the light-emitting device with the structure shown FIG. 4 has an inherent disadvantage when the device is formed on the substrate 101 heavily doped with sulfur (S). That is, the impurities doped in the substrate 101 easily diffuse into the p-type blocking layer 108 during the growth of this p-type layer 108, which disarranges the interface between the p-type layer and the n-type layer to degrade the performance of the device.

The present invention is to provide a structure for the light-emitting device that prevents the inter diffusion of impurities in the substrate to the other layer during the growth of the other layer, even when the substrate is heavily doped to reduce the dislocations.

SUMMARY OF THE INVENTION

A light-emitting device of the present invention has a feature that the device includes an n-type InP substrate, an optical guiding portion, a current blocking portion and an n-type semiconductor layer. The InP substrate is doped with sulfur (S) and has an etch pit density less than 100 $cm^{-2}$ at a primary surface thereof. The optical guiding portion, which is provided on the primary surface of the n-type InP substrate, forms as mesa structure includes an active layer. The current blocking portion is provided in both sides of the optical guiding portion so as to bury the mesa structure of the optical guiding portion. The n-type semiconductor layer is provided between the active layer in the mesa structure and the n-type InP substrate, and between the current blocking portion and the n-type InP substrate.

Because the light-emitting device of the invention provides the n-type semiconductor layer between the n-type InP substrate and the current blocking portion, which separates the current blocking portion from the substrate, such arrangement of the layer may prevent the impurities doped in the substrate from diffusing into the current blocking portion. Moreover, the n-type layer between the current blocking layer and the n-type substrate may reduce the parasitic capacitance of the device and may increase the reverse breakdown voltage of the device, which enhance the high frequency performance of the device.

The device with such layer structure may be practical even when the carrier concentration of the heavily doped InP substrate is greater than $3 \times 10^{18}$ $cm^{-3}$, or even when the n-type substrate heavily doped with sulfur (S) has the etch pit density (EPD) less than 100 $cm^{-2}$. Then-type semiconductor layer between the current blocking portion and the n-type substrate preferably has the carrier concentration less than that of the n-type substrate, is preferably doped with silicon (Si), and has a thickness greater than 0.3 μm, which effectively prevents the diffusion of the impurities in the substrate to the current blocking portion.

DETAILED DESCRIPTION OF THE INVENTION

Next, preferred embodiments of the present invention will be described as referring to accompanying drawings. In the description of the drawings, the same symbols or the same numerals will refer to the same elements without overlapping explanations.

Figure 1:
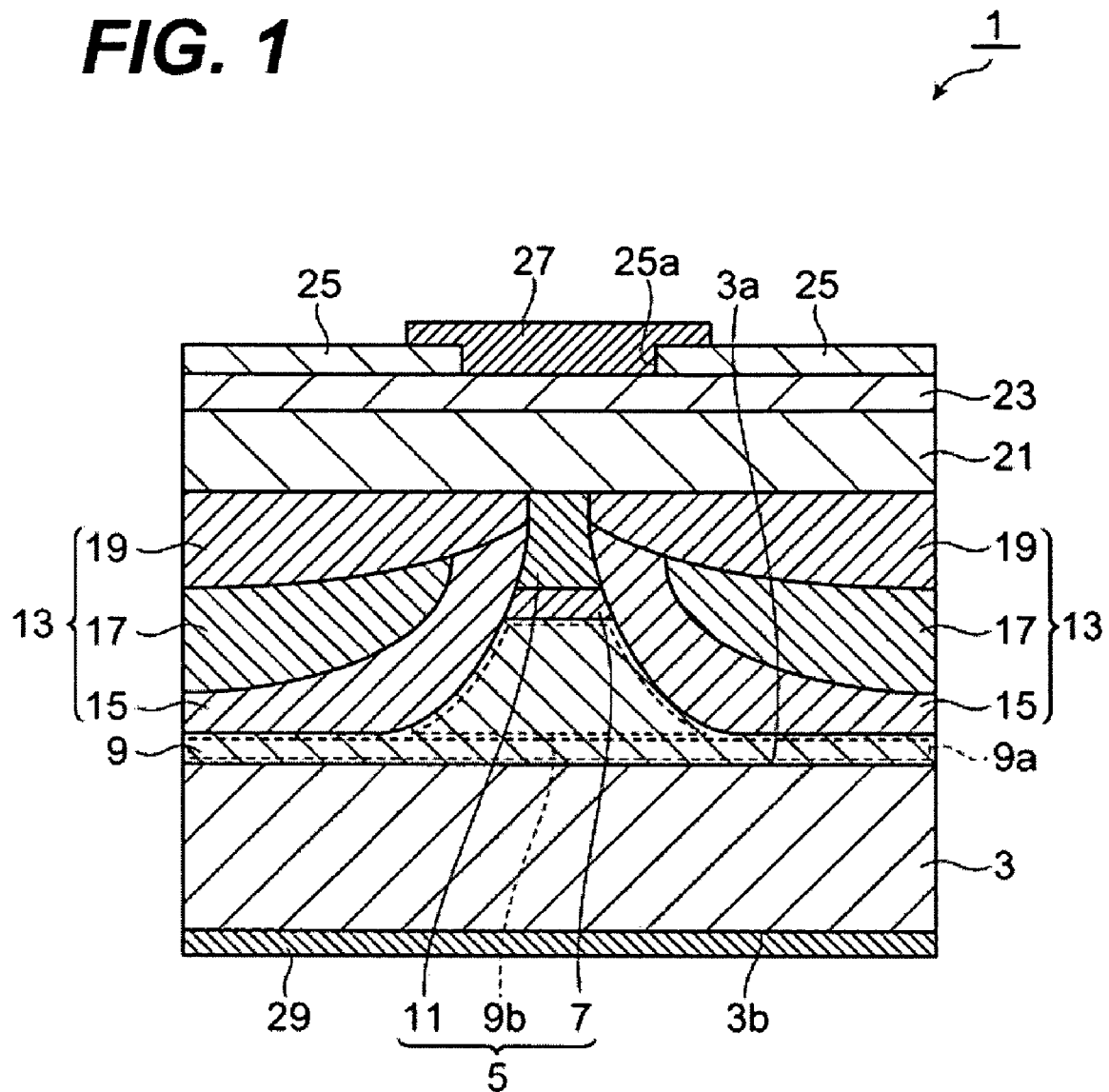
FIG. 1 is a sectional view of a semiconductor light-emitting device according to an embodiment of the present invention.

FIG. 1 is a cross sectional view of a semiconductor light-emitting device 1 according to an embodiment of the present invention. FIG. 1 is taken across an optical axis of the light-emitting device along which the light propagates. The light-emitting device 1 shown in FIG. 1 is as type of a semiconductor laser diode or a semiconductor optical modulator.

The light-emitting device 1 includes a guide portion 5, a semiconductor substrate 3 made of InP, and a current blocking portion 13. The InP substrate 3, which is doped with sulfur (S), has an EPD smaller than 100 cm-2 at the primary surface 3a thereof with a carrier concentration greater than $3 \times 10^{18}$ cm$^{-3}$, preferably greater than $6 \times 10^{18}$ cm$^{-3}$ and less than $7 \times 10^{18}$ cm$^{-3}$.

The guide portion 5, which is formed on the primary surface 3a of the InP substrate, shapes in a mesa extending along a direction normal to the page and includes an active layer 7, a portion of an n-type layer 9b and a p-type layer 11. The n-type layer 9 is substantially made of InP based material doped with silicon (Si). The InP based material means a semiconductor included in the group III-V compound material and a lattice constant of which substantially matches to that of the InP or is a value able to grow the epitaxial layer on the InP substrate.

The carrier concentration of the n-type layer 9 is smaller than that of the InP substrate 3, for instance, smaller than $2 \times 10^{18}$ cm$^{-3}$, preferably smaller than $1 \times 10^{18}$ cm$^{-3}$. The n-type layer 9 includes a first portion 9a covering the whole primary surface 3a of the InP substrate 3 and a second portion 9b included in the guide portion 5.

The active layer 7 is formed on the second portion 9b of the n-type layer 9 and is also made of InP based materials. The active layer 7 may be a bulk layer with the signal semiconductor material, but the active layer 7 may has a single quantum well (SQW) structure or a multiple quantum well (MQW) structure, in particular, the active layer may be a stress-induced MQW structure.

The p-type layer 11 is also primary made of an InP based material including p-type impurities such as zinc (Zn). The p-type layer 11 is formed on the active layer 7. Because a refractive index of the active layer is set greater than those of the n-type layer 9 and the p-type layer 11, these three layers may show an optical waveguide function. That is, the n-type layer 9 and the p-type layer function as an n-type cladding layer and a p-type cladding layer, respectively.

The current blocking portion 13 is provided on the first portion 9a of the n-type layer 9 so as to bury the guide portion 5. The current blocking portion 13 includes a p-type layer 15, an n-type layer 17 and another p-type layer 19. The first p-type layer 15 is formed on the first portion 9a and covers both side surfaces of the guide portion 5. The p-type layer 15 is made of an InP based material and doped with p-type impurities. The n-type layer 17 is provided on the first p-type layer 15 and is made of an InP based material doped with n-type impurities. The second p-type layer 19 is provided on the n-type layer 17 and is made of an InP based material doped with p-type impurities.

Thus, the current blocking portion 13 has an alternating configuration of the n-type layer and the p-type layers on the n-type layer 9, which forms a type of a thyristor structure. Accordingly, the current blocking portion 13 may effectively concentrate carriers into the guide portion 5.

The semiconductor light-emitting device 1 may further provide a p-type semiconductor layer 21 on the guide portion 5 and on the current blocking portion 13. This p-type layer 21, which is substantially made of an InP based material doped with p-type impurities, functions as an upper cladding layer to confine light within the guide portion 5. The semiconductor light-emitting device 1 may further provide a contact layer 23 on the p-type layer 21. The contact layer 23, which is also made of InP based material and doped with p-type impurities, makes an electrical contact to an anode electrode and the guide portion 5. The detail of the anode electrode will be described later in this specification.

On the contact layer is provided with an insulating film 25, which is made of inorganic material such as silicon die-oxide (SiO$_2$).

The light-emitting device 1 may further provide the anode electrode 27 on the guide portion 5. The anode electrode 27 electrically comes in contact to the contact layer 23 through an opening 25a formed in the insulating film 25. The anode electrode 23 is also connected to a pad formed on the insulating film 25, which is not appeared in FIG. 1 and is to be wire-bonded to the electronic circuit provided outside of the light-emitting device 1. The device 1 further provides a cathode electrode 29 on a whole back surface 3b of the InP substrate 3.

An exemplary configuration of the semiconductor light-emitting device is shown in the following table:

Active Layer 7
    well layer/barrier layer: 6 nm/7 nm (11 pairs), total 262 nm including uppermost and lowermost optical confinement layers
    compressing stress due to lattice-mismatching of 0.8%

N-Type Layer 9
    Si doped InP, first portion 9a/second portion 9b=0.3 μm/1.2 μm P-Type Layer 11
    Zn-doped InP, thickness 440 nm Current Blocking Portion 13

| | |
|---|---|
| first p-type layer 15: | Zn-doped InP |
| n-type layer 17: | Si-doped InP |
| second p-type layer 19 | Zn-doped InP |
| Total thickness of 2 μm | |

P-Type Layer 21
    Zn-doped InP

Contact Layer 23
    Zn-doped InGaAs.

Here, the optical confinement layers in the active layer are provided in the outermost part of the active layer, namely, these layers come in contact to the n-type layer 9 and the p-type layer, respectively. These confinement layers are to confine light within the active layer without scattering carries, accordingly, the energy gap of these layers are between the active layer and the n-type or p-type cladding layers, and the refractive index thereof is a value between that of the active layer and the cladding layers.

Figure 2A:
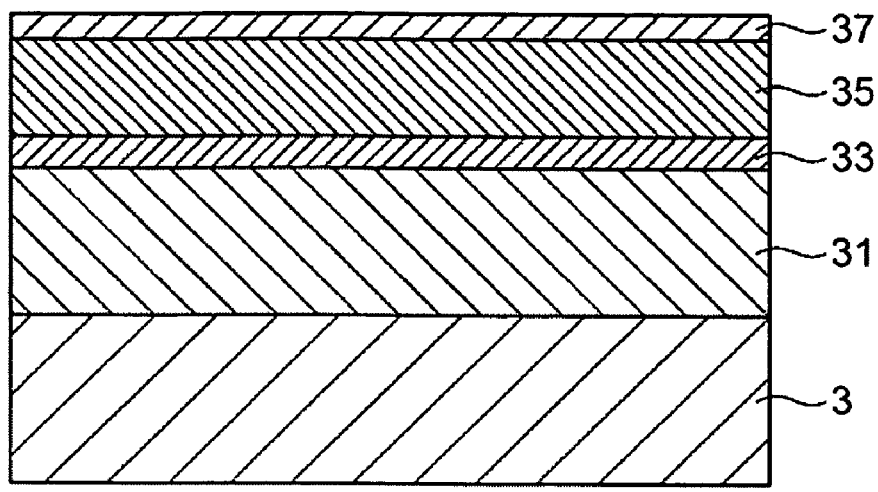
FIG. 2A is a process to form the semiconductor light-emitting device shown in FIG. 1.
Figure 2B:
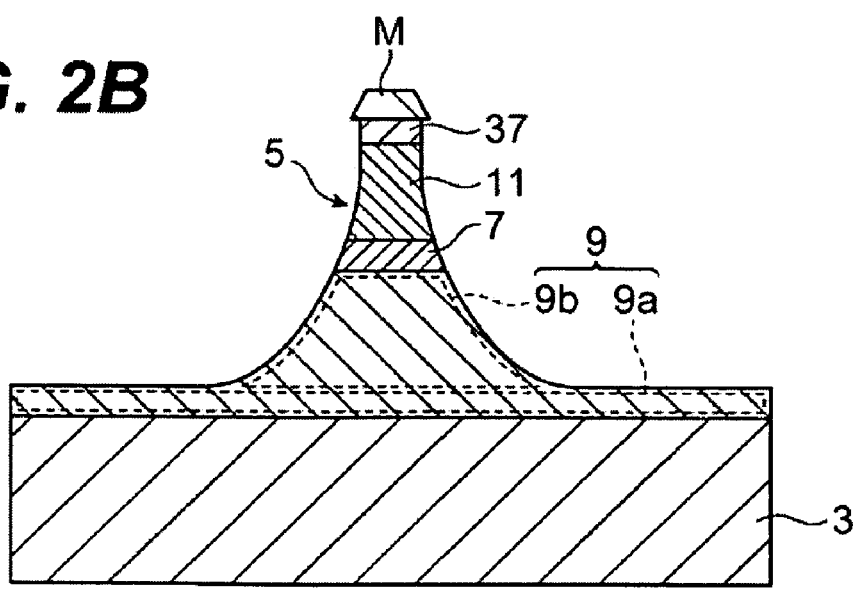
FIG. 2B is a process subsequent to FIG. 2A.
Figure 3A:
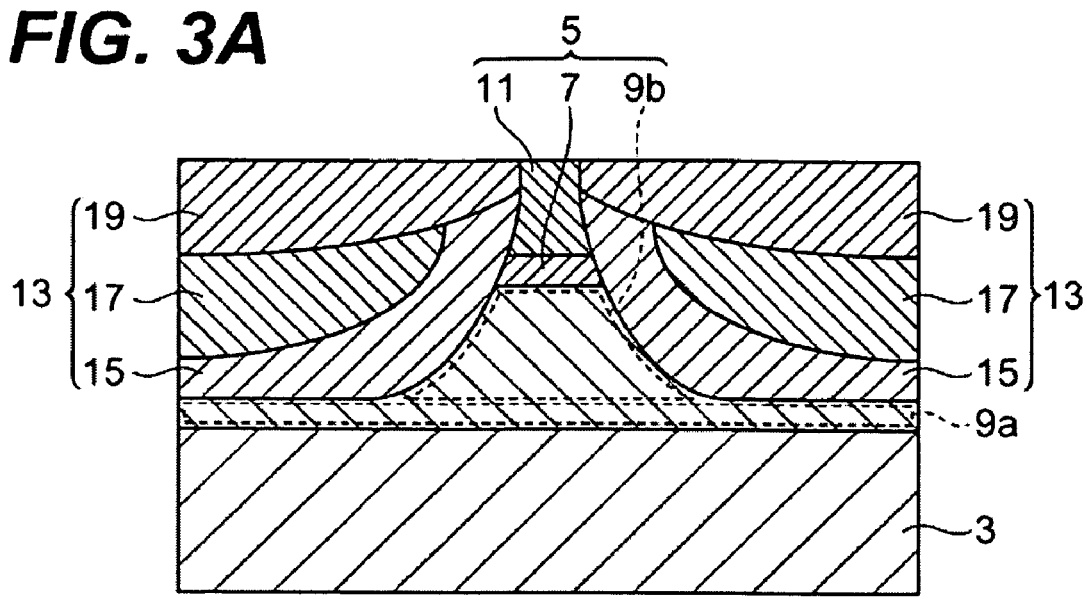
FIG. 3A is the cross sectional view of the process subsequent to FIG. 2B to form the light-emitting device shown in FIG. 1.

Next, an exemplary process for manufacturing the light-emitting device of the present invention will be described as referring to FIGS. 2 and 3, which are the cross section of the semiconductor light-emitting device same as that shown in FIG. 1 and explain the process to form the device 1.

First, an n-type InP substrate is prepared. This substrate shows the EPD smaller than 100 cm$^{-3}$. As shown in FIG. 2A, sequential growth of a plurality of semiconductor layers, 31 and 33, are carried out on the primary surface 3a of the n-type InP substrate 3. The layer 31 becomes the n-type layer 9, while the layer 33 becomes the active layer 7 after the process and includes multi layers of InGaAsP and InP alternating to each other. The conventional OMVPE (Organic Metal Vapor Phase Epitaxy) technique may carry out the epitaxial growth of these layers. The semiconductor layer 9 shows a function of a buffer layer to grow semiconductor layers thereof with good crystal quality. Subsequent to the growth above, a p-type InP layer 35 and a p-type InGaAs layer 37 are sequentially grown on the layer 33. The former layer becomes the p-type layer 11.

Subsequent to the layer growth above, the process forms a mask M extending along the optical axis of the device, which is normal to the page, on the p-type InGaAs layer 37. The mask M may be made of inorganic material of silicon, such as silicon nitride and silicon oxide. The process etches portions of the multi layers of InGaAsP/InP 33 and the p-type InP layer 35 not covered by the mask M. In this process, the etching should be stopped before the n-type InP substrate exposes, thus, the n-type layer 9 may be formed left with the first portion 9a and the guide portion 5 is formed so as to include the second portion 9b, the active layer 7 and the p-type layer 11 in the mesa shape. It is preferable for the present method to configure the n-type InP layer 31 to be thick enough to leave the first portion 9a securely, preferably thicker than 1.2 µm.

Subsequently, the process selectively grows, on the first portion 9a, the p-type InP layer 15, the n-type InP layer 17 and the p-type InP layer 19 so as to bury the guide portion 5 as the mask m and the layer 37 are left on the top of the guide portion 5. Also the OMVPE technique may carry out this selective growth of the current block portion 13. Moreover, the first p-type InP layer 15 may come in contact to the sides of the mesa of the guide portion 5 to secure the sides, in particular, the sides of the active layer 7. Thus, the current blocking portion may be formed. After the selective growth, the mask M and the InGaAs layer 37 are removed.

Figure 3B:
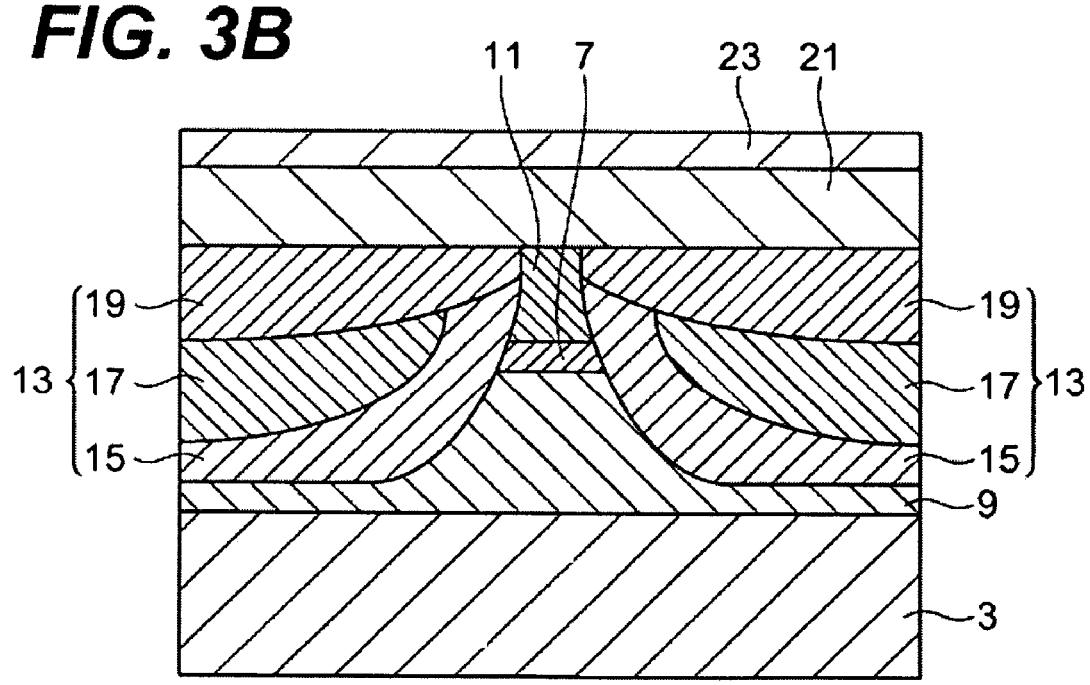
FIG. 3B shows the process subsequent to FIG. 3A.

Next, the process grows the p-type InP layer 21, which becomes the p-type upper cladding layer 21, and the p-type InGaAs layer, which becomes the p-type contact layer 23, on the guide portion 5 and the current blocking portion 13 by the OMVPE technique, as shown in FIG. 3B. After the growth, the process further forms the insulating inorganic film 25, such as silicon die-oxide $SiO_2$, on the p-type InGaAs contact layer 23, and two electrodes of the anode 27 and the cathode 29 are formed on the inorganic film 25 and on the back surface 3b of the n-type InP substrate, respectively. Thus, the semiconductor light-emitting device shown in FIG. 1 is completed.

Figure 4:
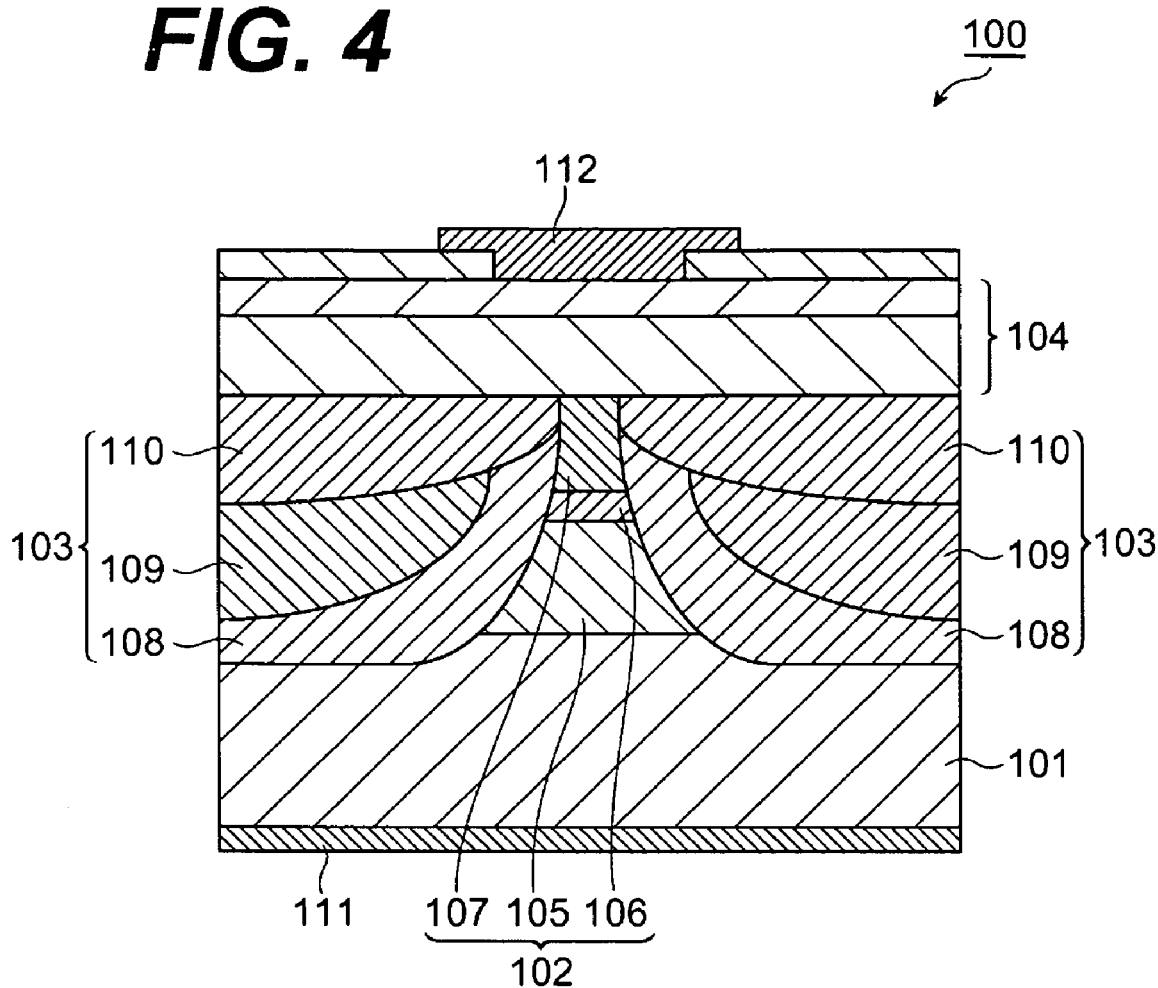
FIG. 4 is a cross sectional view showing a conventional semiconductor light-emitting device.

Next, advantages of the preset invention will be described. The conventional device shown in FIG. 4 configures the mesa for the guide portion so as to include a portion of the n-type InP substrate to secure an enough thickness for the current blocking portion. In this configuration, the p-type layer in the current blocking portion comes in directly contact to the n-type InP substrate, which enhances the inter diffusion of impurities, such as sulfur (S) doped in the substrate, to the p-type current blocking portion.

However, this phenomena of the inter diffusion of the impurities does not cause a problem when the n-type InP substrate intrinsically contains a large number of dislocations, for instance, the EPD greater than $1000 \text{ cm}^{-2}$, which is equivalent to a case where the carrier concentration reaches $1 \times 10^{18} \text{ cm}^{-3}$ to $2 \times 10^{18} \text{ cm}^{-3}$ or greater. Recent n-type InP substrate, in particular, the n-InP substrate doped with sulfur, shows a quite reduced EPD, typically blow $100 \text{ cm}^{-2}$ by the successive request to get the high quality InP substrate for the stress induced MQW active layer.

Because the present light-emitting device 1 provides the n-type InP layer 9, exactly the first portion 9a of the n-type InP layer 9, between the p-type InP layer 13 in the current blocking portion and the n-type InP substrate with relative higher carrier concentration, the inter diffusion of the impurities S in the n-type InP substrate may be effectively prohibited.

Specifically, the diffusiveness of the sulfur doped in the substrate becomes smaller when the InP doped with sulfur (S) comes indirectly contact to the InP doped with silicon (Si) compared to a case when the InP doped with S comes in directly contact to the InP doped with zinc (Zn). Thus, the inter diffusion of impurities S from the S-doped substrate to the Si-doped InP layer becomes quite small. Moreover, the diffusion constant of silicon (Si) is quite small compared to that of sulfur (S). Accordingly, almost not inter diffusion of impurities may occur at the interface between the Si-doped InP layer and the Zn-doped InP layer. Thus, the present light-emitting device may substantially prevent the inter diffusion of the S-impurities in the n-type InP substrate to the Zn-doped InP layer in the current blocking portion, which may reduce the parasitic capacitance of the device and may enhance not only the high frequency performance but also the breakdown voltage thereof. Moreover, the Si-doped InP layer with a moderate carrier concentration between the S-doped InP substrate and thep-typecurrentblockinglayer-mayreducetheparasiticresistancebetween two electrodes, which enhances not only the breakdown voltage but the high frequency performance of the device.

The light-emitting device 1 of the present invention is applicable to the n-type InP substrate 3 with the carrier concentration greater than $3 \times 10^{18} \text{ cm}^{-3}$. To obtain high quality n-type InP substrate, the EPD of which is $100 \text{ cm}^{-2}$ or less, the doping condition of sulfur impurities to in the substrate is inevitable to be greater than those showing such high carrier concentration. According to the present light-emitting device 1, even the n-type InP substrate has such high carrier concentration, may prevent the inter diffusion of sulfur impurities from the substrate 3 to the p-type current blocking portion 13.

The carrier concentration in the n-type layer 9, namely, the lower cladding layer, is preferable to be smaller than that of the n-type InP substrate 3 to prevent the inter diffusion of the impurities from the substrate 3 to the p-type current blocking portion 13, and the dopant of the n-type layer is preferable to be silicon (Si). Moreover, the thickness of the n-type layer 9 is preferable to be greater than 0.3 µm.

While the preferred embodiments of the present invention have been described in detail above, many changes to these embodiments may be made without departing from the true scope and teachings of the present invention. For example, the active layer may provide a periodic undulation able to operate as an optical grating. The embodiments described above concentrates on a semiconductor laser diode as one type of the light-emitting device, however, the invention is applicable to the other semiconductor optical device, such as an optical coupler and an optical multiplexer/demultiplexer, or an optical device integrating such optical passive devices with optical active devices on a common substrate. Thus, the foregoing is illustrative of the present invention, and is not to be construed as limiting thereof. The invention is defined by the following claims, with equivalents of the claims to be included therein.

We claim:

1. A light-emitting device, comprising:
   an n-type InP substrate doped with sulfur and having an etch pit density less than $100 \text{ cm}^{-2}$ at a primary surface thereof;
   an optical guiding portion provided on the primary surface of the InP substrate, the optical guiding portion forming a mesa structure included with an active layer therein;

a current blocking portion provided in both sides of the optical guiding portion so as to bury the mesa structure of the optical guiding portion, the current blocking portion including a first p-type semiconductor layer made of InP based material, an n-type semiconductor layer made of InP based material, and a second p-type semiconductor layer made of InP based material; and an n-type layer doped with silicon (Si) and provided between the active layer and the n-type InP substrate, and between the first p-type semiconductor layer of the current blocking portion and the n-type InP substrate.

2. The light-emitting device according to claim 1, wherein the n-type InP substrate has a carrier concentration greater than $3 \times 10^{18}$ cm$^{-3}$ and less than $7 \times 10^{18}$ cm$^{-3}$.

3. The light-emitting device according to claim 1, wherein the n-type layer between the first p-type semiconductor layer of the current blocking portion and the n-type InP substrate has a carrier concentration less than a carrier concentration of the n-type InP substrate.

4. The light-emitting device according to claim 1, wherein the n-type layer has a thickness greater than 0.3 μm at a portion between the current blocking portion and the n-type InP substrate.

5. A semiconductor laser diode, comprising:
an n-type InP substrate doped with sulfur (S);
a lower cladding layer made of n-type InP doped with silicon (Si), wherein the lower cladding layer has a carrier concentration greater than $3 \times 10^{18}$ cm$^{-3}$ and less than $7 \times 10^{18}$ cm$^{-3}$;
an active layer having a multiple quantum well structure (MQW) induced with a stress;
an upper cladding layer made of p-type InP; and
a current blocking layer including a first p-type InP layer, an n-type InP layer and a second p-type InP layer,
wherein the lower cladding layer includes a first portion and a second portion, the first portion being provided between the n-type InP substrate and the first p-type InP layer of the current blocking layer, and between the n-type InP substrate and the second portion of the lower cladding layer, the second portion being provided on the first portion of the lower cladding layer, and
wherein the second portion of the lower cladding layer, the active layer and the upper cladding layer form a mesa structure that operates as an optical guiding portion.

6. The semiconductor laser diode according to claim 5, wherein the first p-type InP layer in the current blocking layer is doped with zinc (Zn).

7. The semiconductor laser diode according to claim 5, wherein the first p-type InP layer covers and secures both sides of the mesa structure.

8. The semiconductor laser diode according to claim 5, wherein the lower cladding layer has a carrier concentration less than a carrier concentration of the n-type InP substrate.

9. The semiconductor laser diode according to claim 5, wherein the first portion of the lower cladding layer has a thickness greater than 0.3 μm.

10. The semiconductor laser diode according to claim 5, wherein the n-type InP substrate has an etch pit density less than 100 cm$^{-2}$.

* * * * *